(12) United States Patent
Fan et al.

(10) Patent No.: US 8,061,959 B2
(45) Date of Patent: Nov. 22, 2011

(54) BOARD INVERTER

(75) Inventors: Ya-Ling Fan, Shenzhen (CN);
Ching-Hung Pi, Taoyuan (TW);
Cheng-Ta Tu, Taoyuan (TW); Chih-Yi Tu, Taoyuan (TW); Cheng-Hsien Lin, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 581 days.

(21) Appl. No.: 12/202,551

(22) Filed: Sep. 2, 2008

(65) Prior Publication Data
US 2009/0175713 A1    Jul. 9, 2009

(30) Foreign Application Priority Data
Jan. 4, 2008 (TW) ............................... 97100307 A

(51) Int. Cl.
*B21D 43/10* (2006.01)
*B21D 43/04* (2006.01)
*B65H 15/00* (2006.01)
(52) U.S. Cl. ........... 414/783; 91/51; 91/375 R; 414/759; 414/771; 414/774
(58) Field of Classification Search .................. 198/403; 414/561, 626, 734–735, 754, 758, 759, 763, 414/771, 773, 774, 783; 901/19, 22, 8; 91/376 A, 5

See application file for complete search history.

(56) References Cited

U.S. PATENT DOCUMENTS

| 1,519,248 | A | * | 12/1924 | Fox | 414/561 |
| 3,777,618 | A | * | 12/1973 | Iwai et al. | 91/61 |
| 3,777,902 | A | * | 12/1973 | Potter | 414/741 |
| 4,892,183 | A | * | 1/1990 | Fenton | 198/468.3 |
| 6,543,605 | B2 | * | 4/2003 | Faitel | 198/468.6 |
| 2006/0179639 | A1 | * | 8/2006 | Nussbaum et al. | 29/563 |

* cited by examiner

*Primary Examiner* — Gregory Adams
(74) *Attorney, Agent, or Firm* — Atlis Law Group, Inc.

(57) ABSTRACT

The present invention relates to a board inverter and a boarding inverting system. The board inverter includes a support, a first board picking device, an second board picking device and a controller. Each of the first board picking device and the second board picking device includes a driving mechanism and a first board picking device. The driving mechanism comprises a first linear driving means mounted on the support, a second linear driving means mechanically coupled to the first linear driving means, and a rotary driving means attached to the second linear driving means. The controller is connected to all the power supply members. The controller controls the motion of the first board picking device and the second board picking device such that the first board picking device and the second board picking device cooperatively inverting workpieces transmitted on a production line. The board inverter can be installed on a production line without altering the arrangement of existing production line.

18 Claims, 12 Drawing Sheets

BOARD INVERTER

BACKGROUND

1. Technical Field

The present invention relates to a board inverter for inverting workpieces and, more specifically, to a device for inverting sheet-like workpieces, for example, printed circuit boards.

2. Discussion of Related Art

Printed circuit boards (PCBs) are widely employed in electronic devices for mounting various electronic components such as resistor, capacitor, and integrated circuits thereon. PCBs can simply be classified into single-sided PCBs, double-sided PCBs and multilayer PCBs. In manufacturing process of PCBs, especially in manufacturing process of double-sided PCBs, two opposite surfaces of PCBs should be protected with photoresist film. Therefore, PCBs must be inverted after photoresist film is applied on one surface thereof for applying photoresist film on another surface thereof.

Board inverter can be used to invert the PCBs. However, when a conventional board inverter is introduced into an existing production line of PCBs, the existing arrangement of the productions line have to be broken and the board inverter is mounted between two sections of the production line. In spite of increased cost, a workshop is usually short of adequate space for mounting such board inverter.

Therefore, there is a desire to develop an on-line board inverter that is capable of inverting PCBs on a transmission belt without breaking the existing arrangement of the transmission belt.

SUMMARY

In one embodiment, a board inverter includes a support, a first board picking device, an second board picking device and a controller. Each of the first board picking device and the second board picking device includes a driving mechanism and a first board picking device. The driving mechanism includes a first linear driving means mounted on the support, a second linear driving means mechanically coupled to the first linear driving means, and a rotary driving means attached to the second linear driving means. The controller is connected to the first linear driving means, the second linear driving means, the rotary driving means of the first board picking device and the second board picking device.

This and other features and advantages of the present invention as well as the preferred embodiments thereof and a board inverter in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE EXEMPLARY EMBODIMENTS

Figure 1:
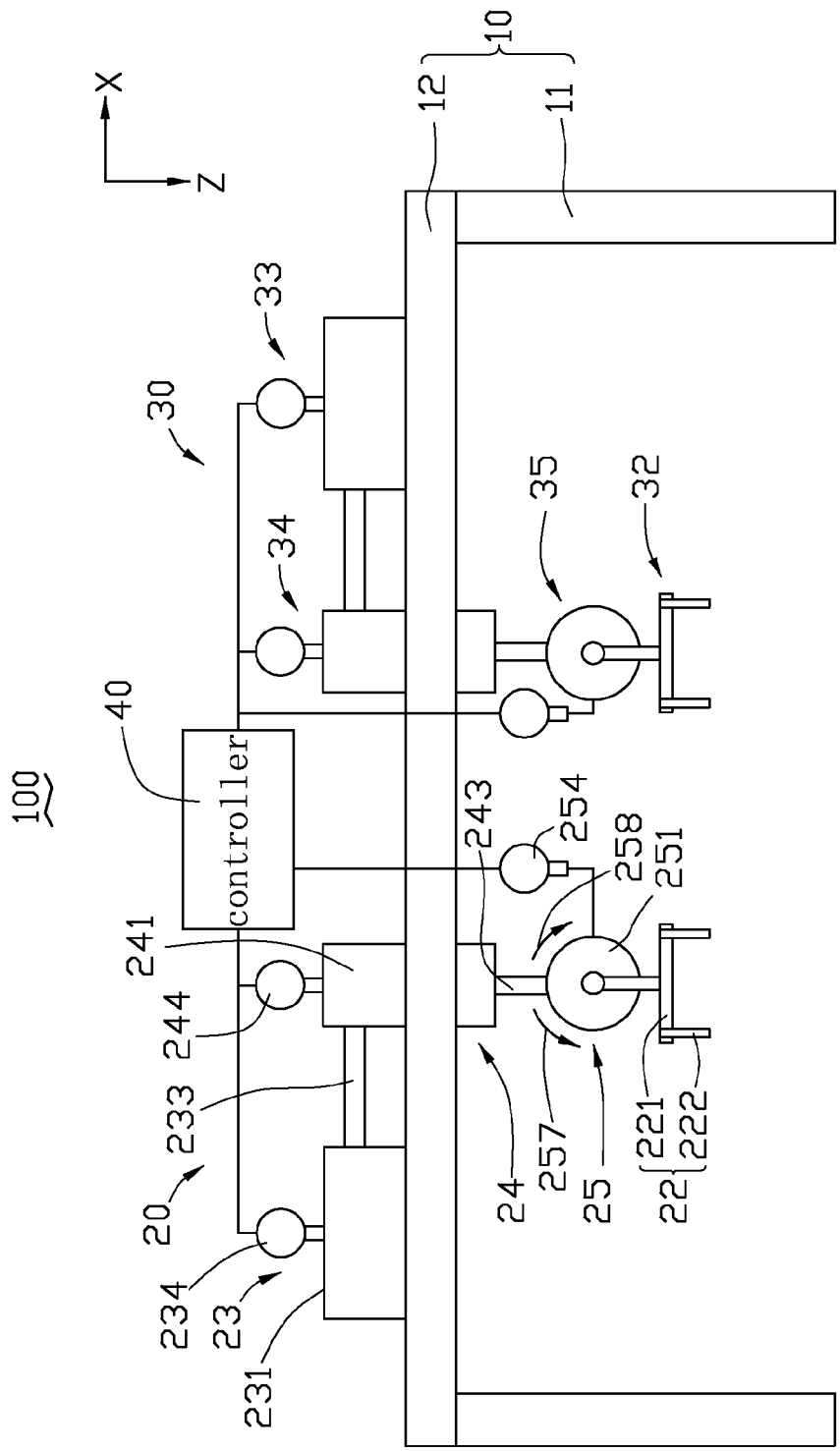
FIG. 1 illustrates a board inverter in accordance with a first embodiment.
Figure 2:
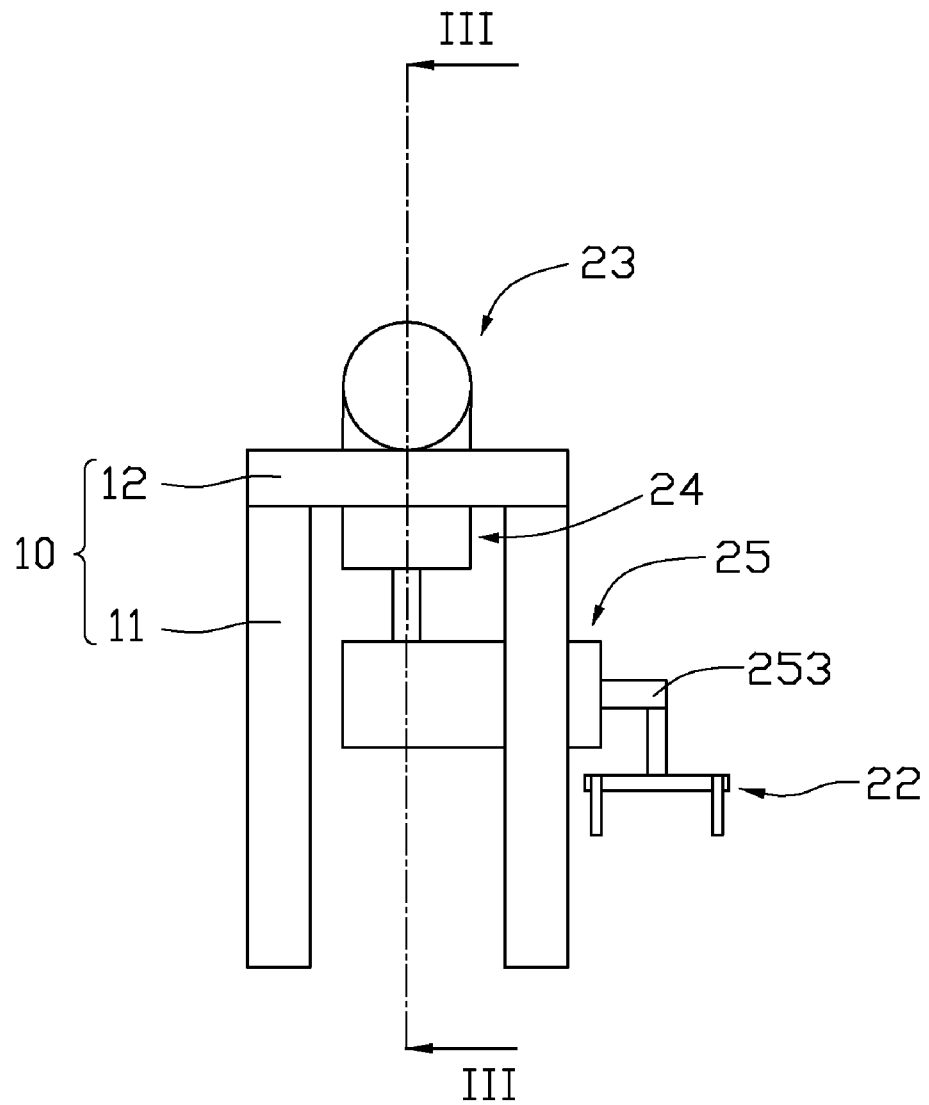
FIG. 2 is a side view of FIG. 1.
Figure 3:
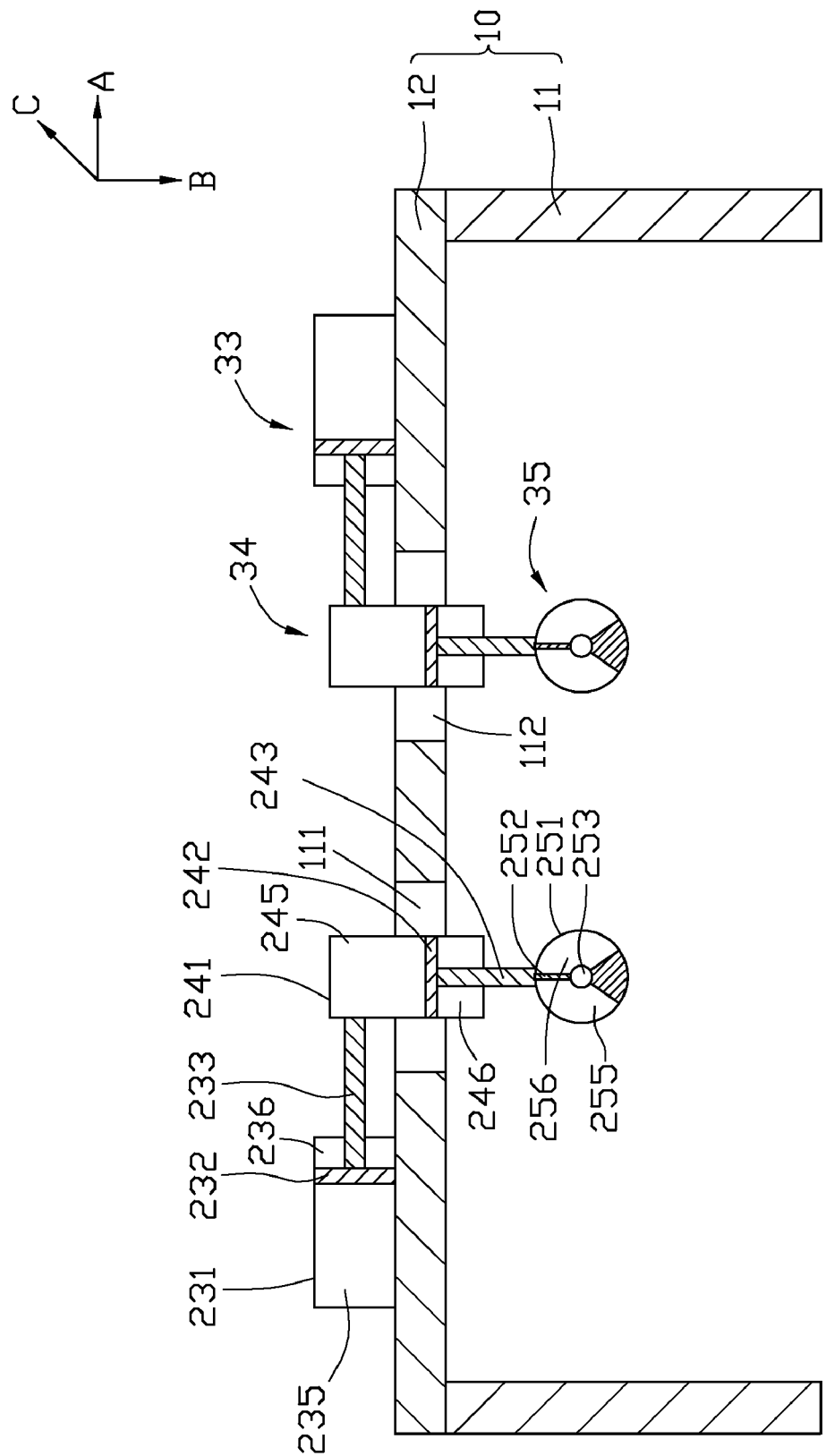
FIG. 3 is a cross sectional view of FIG. 1.

Referring to FIGS. 1 to 3, a board inverter 100 for inverting boards includes a support 10, a first board picking module 20, an second board picking module 30 and a controller 40. The first board picking module 20 and the second board picking module 30 are mounted on the support 10. The first board picking module 20 is configured for capturing a PCB transmitted on a transmission mechanism and feeding it to the second board picking module 30. The second board picking module 30 is configured for inverting the PCB and then placing the PCB on the transmission mechanism. The motion of the first board picking module 20 and the second board picking module 30 is controlled by the controller 40.

The support 10 includes a support plate 11 and four legs 12. An end of each of the four legs 12 are vertically connected to the support plate 11. Thus, four legs 12 are parallel with each other. In the present embodiment, the support 10 is a desk. Two through holes 111, 112 are formed in the support plate 11. Preferably, each leg 12 can be equipped with a wheel, in such circumstance, the support 10 become a carriage.

The first board picking module 20 includes a driving mechanism 21 and a first board picking device 22. The driving mechanism 21 includes a first linear driving means 23, a second linear driving means 24 and a rotary driving means 25. The first linear driving means 23 is mounted on the support 10. The second linear driving means 24 is mechanically coupled to the first linear driving means 23 such that the first linear driving means 23 is capable of driving the second linear driving means 24 to move in a first direction (X direction in FIG. 1). The first board picking device 22 is mechanically coupled to the second linear driving means 24. The second linear driving means 24 is configured for driving the first board picking device 22 to move in a second direction (Z direction in FIG. 1). As a result, the first board picking device 22 is capable of moving freely in the first and second directions.

In the first embodiment, the first linear driving means 23 includes a first cylinder 231, a first piston 232, a first piston rod 233 and a power supply member 234. The first piston 232 is slidably disposed in the first cylinder 231 thereby dividing an inner space of the first cylinder 231 into two separated chambers 235, 236. An end of the first piston rod 233 is fixed to the first piston 232 and the other end (outmost end) of the first piston rod 233 extends outwardly from the first cylinder 231. Examples of the power supply member 234 include air compressor and hydraulic press. The power supply member 234 is in communication with the chamber 235. The power supply member 234 is configured for providing a highly compressed working medium, such as, air, fluids such as water and oils. The compressed working medium can supply power to drive the first piston 232 moving in the first direction (X direction in FIG. 1).

The second linear driving means 24 has a similar configuration to the first linear driving means 23. An installation direction of the second linear driving means 24 is different from the first linear driving means 23. The second linear driving means 24 includes a second cylinder 241, a second piston 242, a second piston rod 243 and a power supply member 244. The second cylinder 241 is fixed to an end of the first piston rod 232. The second piston 242 is slidably disposed in the second cylinder 241 thereby dividing an inner space of the second cylinder 241 into two separated chambers 245, 246. An end of the second piston rod 243 is fixed to the second piston 242 and the other end of the second piston rod 243 extends outwardly from the second cylinder 241. Examples of the power supply member 244 include air compressor and hydraulic press. The power supply member 244 is in communication with the chamber 245. The power supply member 244 is configured for providing a highly compressed working medium, such as, air, fluids such as water and oils. The compressed air and working fluids can supply power to drive the second piston 242 moving in the second direction (Z direction in FIG. 1).

In the first embodiment, the rotary driving means 25 includes a revolving cylinder 251, a partitioning plate 252, a rotary member 253 and a power supply member 254. The partitioning plate 252 is disposed in the revolving cylinder 251 and fixed to an inner sidewall of the revolving cylinder 251. The partitioning plate 252 extends in an axis direction of the revolving cylinder 251. The rotary member 253 is rotatably disposed on the partitioning plate 252. The partitioning plate 252 and the rotary member 253 cooperatively define two separate sealed chambers 255, 256 in the revolving cylinder 251. The two chambers 255, 256 are in communication with the power supply member 254 such that the power supply member 254 can inject working medium into the chambers 255, 256.

In the revolving cylinder 251, if a pressure of the working medium in the chamber 255 isn't equal to that of the chamber 256, the rotary member 253 will rotate to the chamber in which the pressure is lower. Therefore, the rotary member 253 is controlled to rotate by adjusting the pressure of working medium in the two chambers 255, 256. For example, when the pressure in the chamber 256 is larger than that of the chamber 255, the rotary member 253 rotates along a counter-clockwise direction (represented by an arrow 257 in FIG. 1). When the pressure in the chamber 256 is less than that of the chamber 255, the rotary member 253 rotates along a clockwise direction (represented by an arrow 258 in FIG. 1).

The first board picking device 22 includes a holder 221 and a number of vacuum cups 222 mounted on the holder 221. The holder 221 is fixed to an end of the rotary member 253. Each of the vacuum cups 222 is connected to a vacuum system (not shown). The vacuum cups 222 are capable of capturing sheet-like workpieces such as printed circuit boards. It is to be understood that a number of vacuum cups 222 can be replaced by vacuum pads or other suitable vacuum elements.

The second board picking module 30 is similar to the first board picking module 20. The second board picking module 30 includes a driving mechanism 31 and a first board picking device 32. The driving mechanism 31 includes a first linear driving means 33, a second linear driving means 34 and a rotary driving means 35. The driving mechanism 31 is configured for driving the rotary driving means 35 to move in both horizontal and vertical directions. The first board picking device 32 is fixed to the rotary driving means 35 such that the first board picking device 32 can rotate with the rotary driving means 35.

All the power supply members 234, 244, 254 are connected to the controller 40. The controller 40 sends controlling signals (i.e., signals to activate power supply members 234, 244) to the power supply members 234, 244, 254 for each controlling actions of the power supply members 234, 244, 254.

In the first embodiment, the board inverter 100 can be installed above a PCB transmission mechanism without affecting/altering the arrangement of the existing production line of PCBs, resulting in lower cost and higher flexibility. Furthermore, the board inverter 100 can be automatically controlled using the controller 40, thus improve the efficiency of the board-inverting process.

Figure 4:
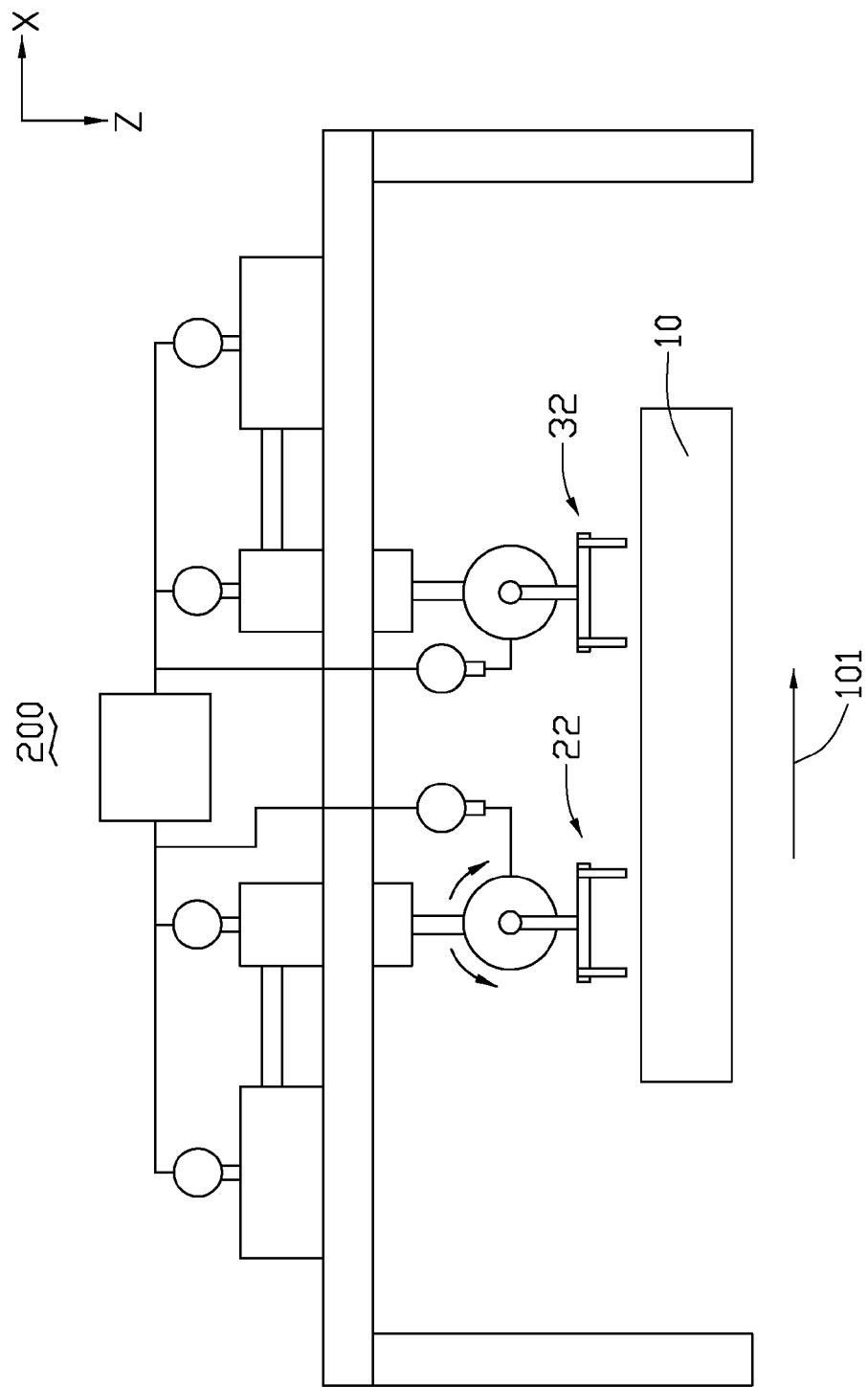
FIG. 4 is a schematic view of a board inverting system including the board inverter of FIG. 1.

FIG. 4 illustrates an inverting system 200 including the board inverter 100 and a board transmission mechanism 10. The board inverter 100 is mounted above the board transmission mechanism 10. The first and second board picking devices 22, 32 are disposed and spaced vertically above the board transmission mechanism 10. Examples of the board transmission mechanism 10 include transmission belt, abreast arranged rollers, and etc. The board transmission mechanism 10 is capable of transporting sheet-like workpieces such as printed circuit boards along a direction from the first board picking module 20 to the second board picking module 30, which is also represented by an arrow 101 in FIG. 4.

Figure 5:
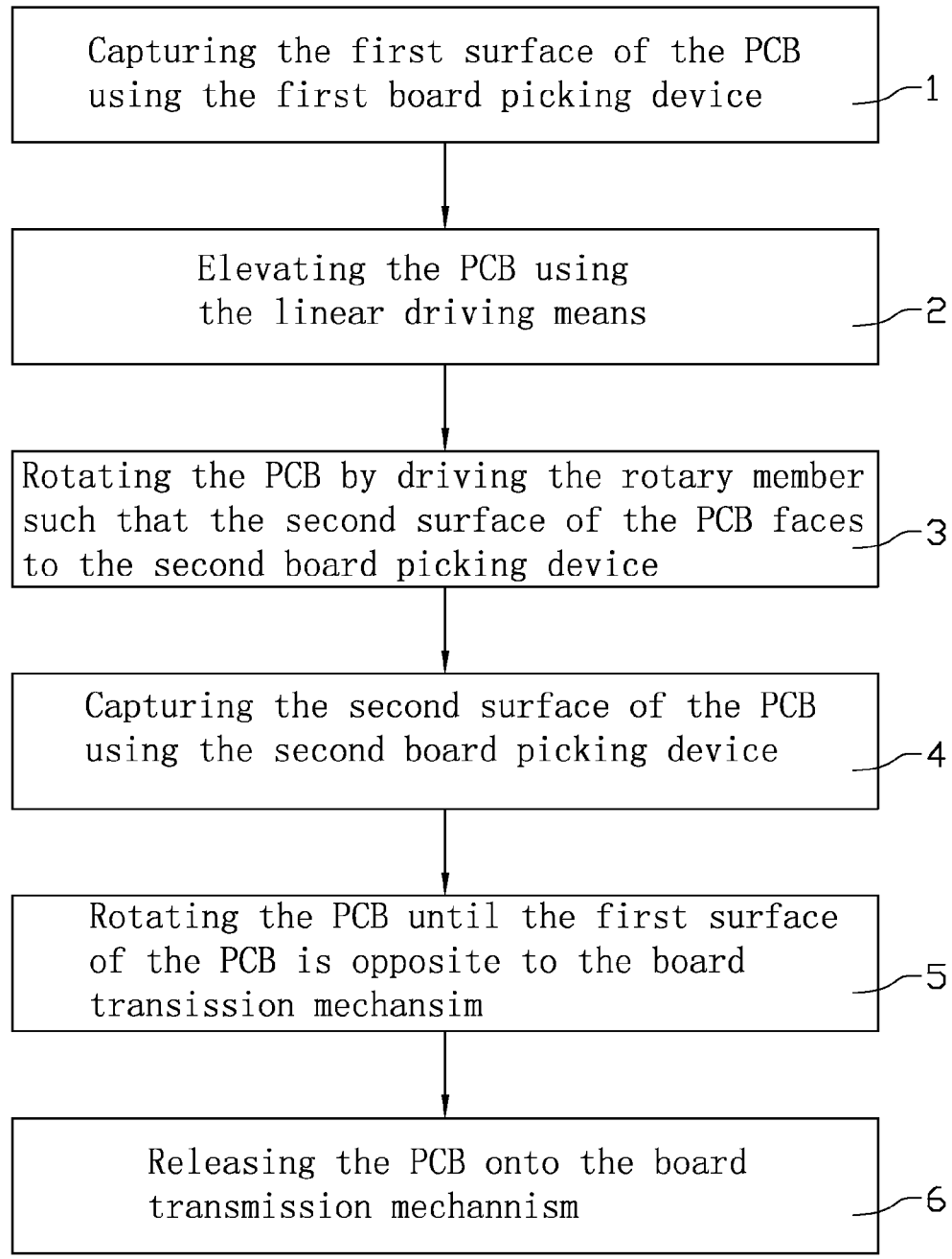
FIG. 5 is a flow chart showing an operation procedure of the board inverting system of FIG. 4.
Figure 6:
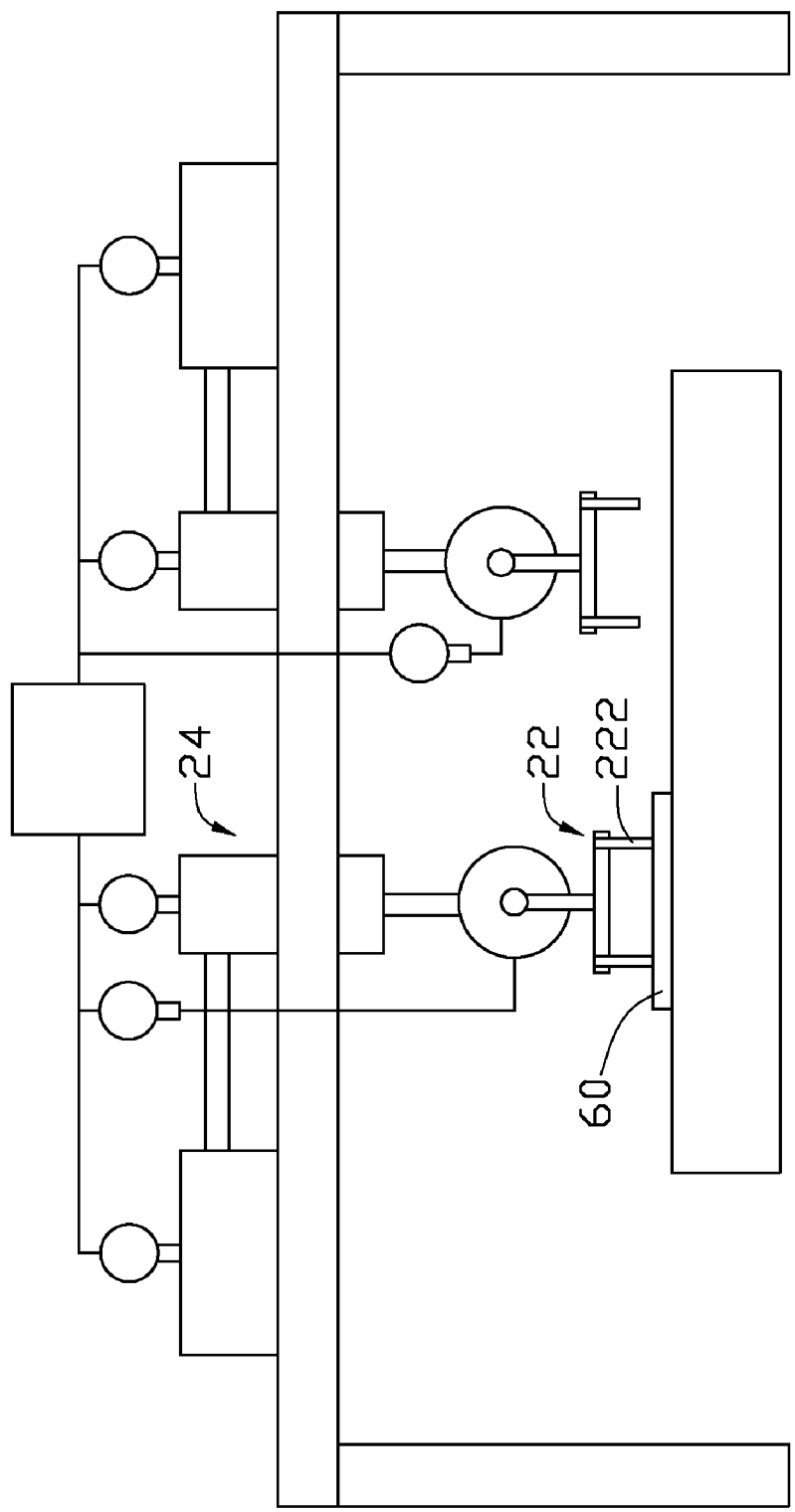
FIGS. 6 to 12 are schematic views of successive states showing that a PCB transmitted on a transmission mechanism is inverted using the board inverting system of FIG. 4.

FIG. 5 shows an operating procedure of the inverting system 200. The detail procedure of inverting PCB transmitted on a transmission mechanism will be described as following with reference to FIGS. 6 through 10. Referring to FIG. 6, a PCB 60 is transmitted on the board transmission mechanism 10. The PCB 60 includes a first surface 201 and a second surface 202 opposite to the first surface 201.

In step 1, referring to FIG. 6, the first surface 201 of the PCB 60 is captured by the first board picking device 22. Firstly, the suction mechanism 22 is driven downwardly using the second linear driving means 24 such that the vacuum cups 222 are in contact with the first surface 201 of the PCB 60. Secondly, the first board picking device 22 is activated so as to capture the first surface 201 of the PCB 60 firmly.

Figure 7:
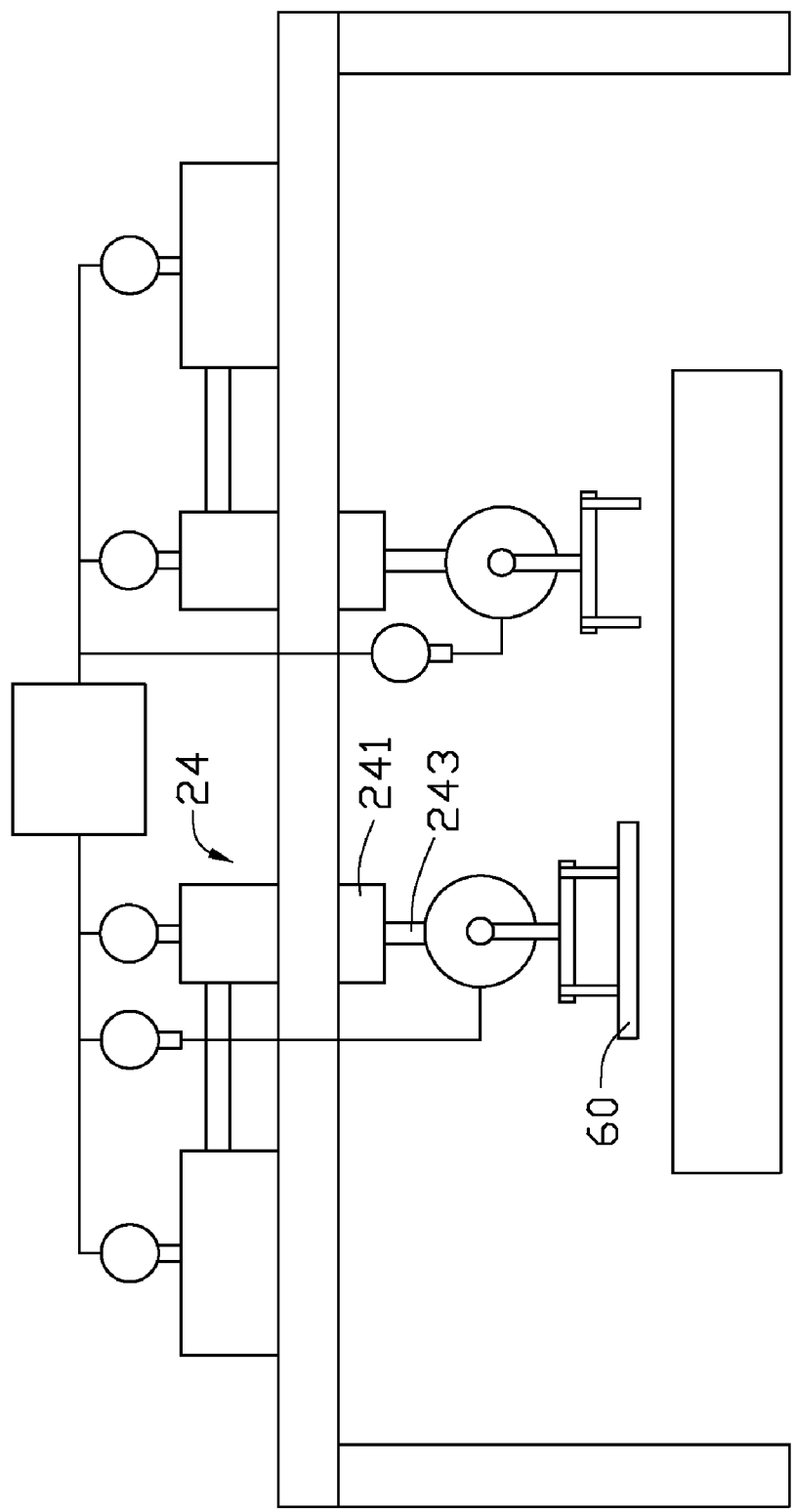

In step 2, referring to FIG. 7, the PCB 60 is elevated using the linear driving means 24. Specifically, the second piston rod 243 will move upwardly when a pressure of working medium filled in the cylinder 241 is lower than standard atmospheric pressure.

Figure 8:
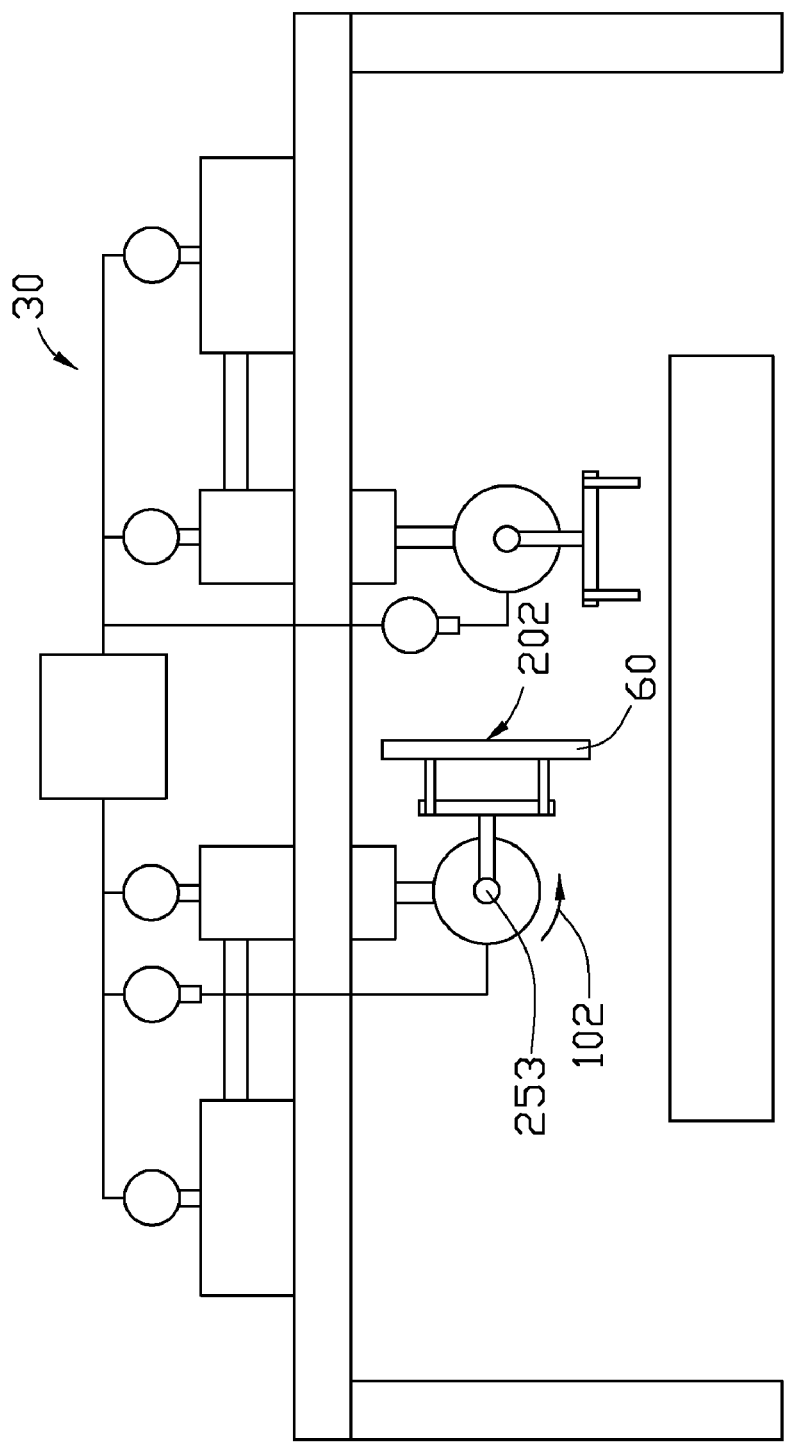

In step 3, referring to FIGS. 3 and 8, the PCB 60 is rotated by driving the rotary member 253 such that the second surface 202 of the PCB 60 faces to the second board picking module 30. As mentioned above, the rotary member 253 will rotate along counter-clockwise direction (presented by an arrow 102 in FIG. 8) when a pressure of working medium in the first chamber 255 is higher than that of the second chamber 256. In the first embodiment, the PCB 60 is firstly elevated and then rotated. However, it is understood that the PCB 60 can be elevated and rotated simultaneously, that is, the step 2 and step 3 can be performed simultaneously.

Figure 9:
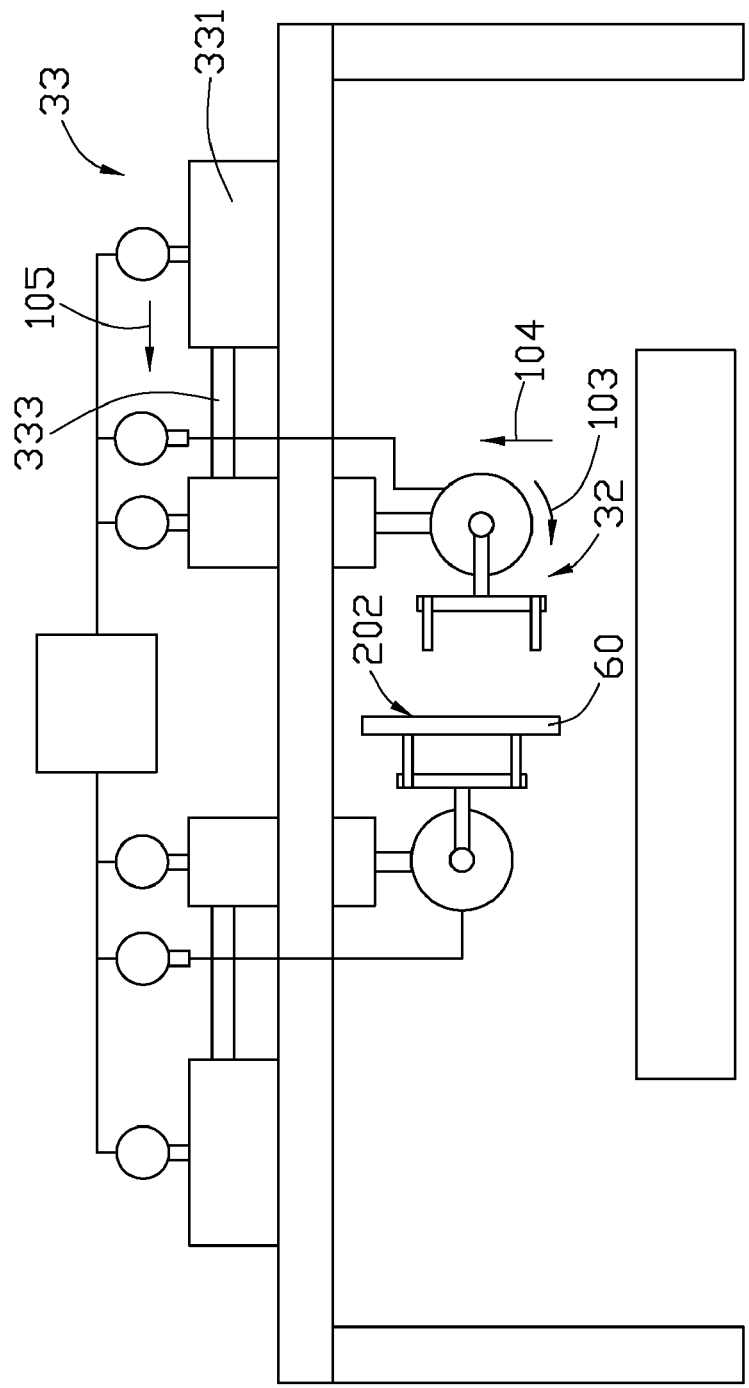
Figure 10:
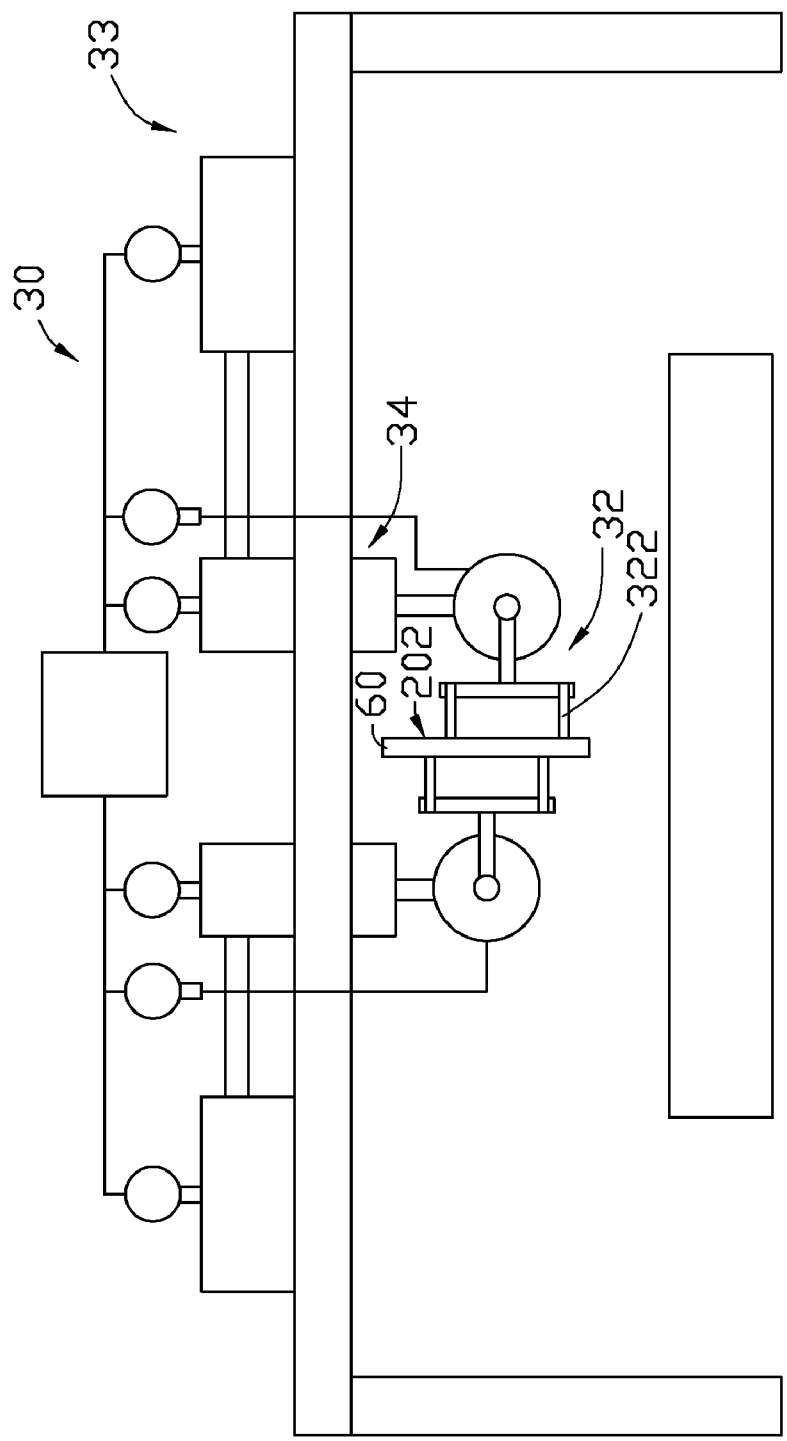

In step 4, referring to FIGS. 9 and 10, the second surface 202 of the PCB 60 is captured by the second board picking device 32 of the second board picking module 30. Firstly, the first board picking device 32 is elevated using the second linear driving means 34, simultaneously, the first board picking device 32 is rotated such that the vacuum cups 322 are facing the PCB 60, the motion of the first board picking device 32 is represented by two arrows 103, 104 in FIG. 9; secondly, the first linear driving means 33 drives the first board picking device 32 to move to the PCB 60 until the vacuum cups 322 are in contact with the second surface 202 of the PCB 60, specifically, the first linear driving means 33 drives the first piston rod 333 to move in a direction away form the first cylinder 331 (represented by an arrow 105 in FIG. 9); thirdly, the first board picking device 32 is activated so as to capture the second surface 202 of the PCB 60 firmly.

Figure 11:
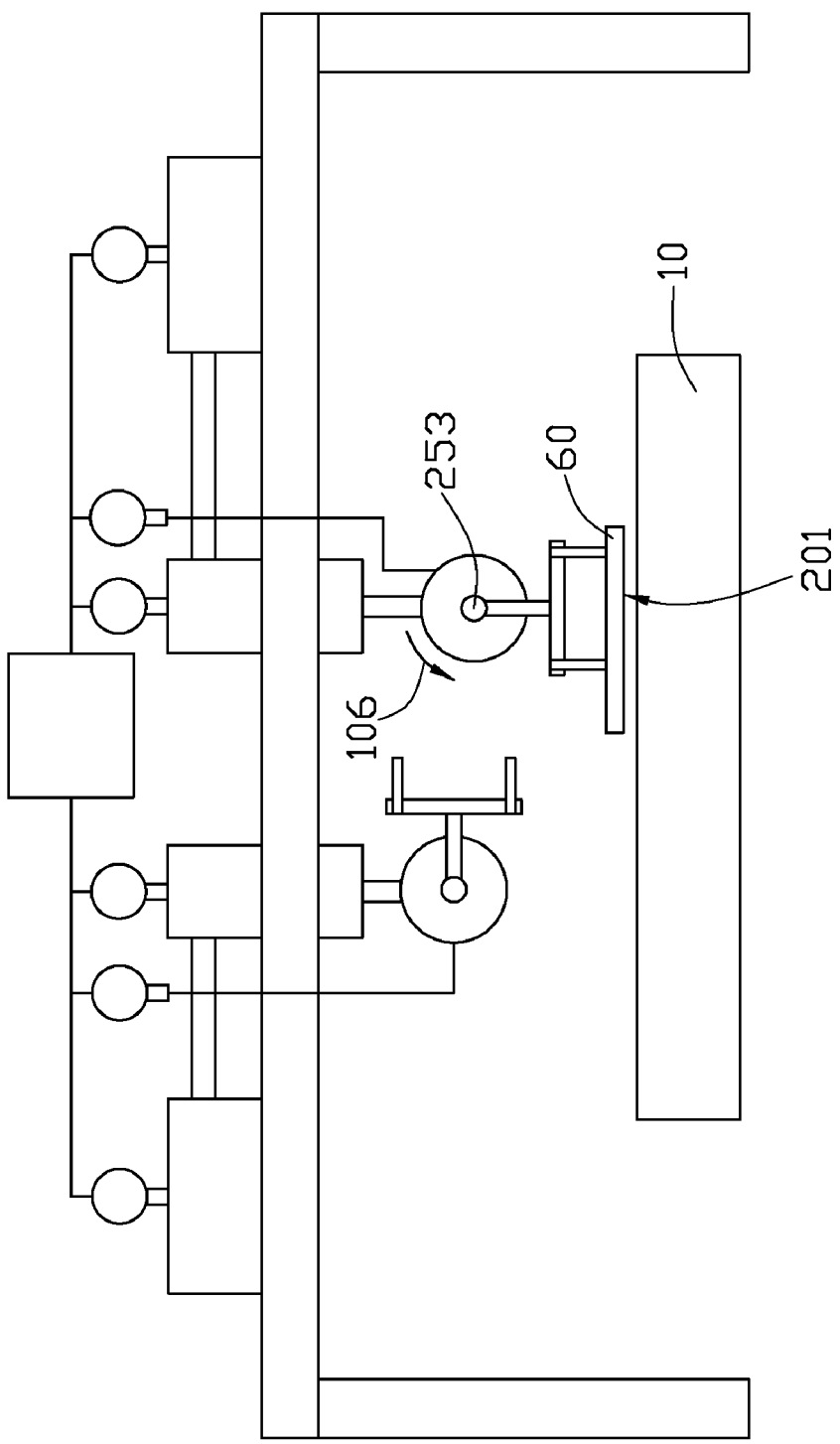

In step 5, referring to FIG. 11, the PCB 60 is rotated until the first surface 201 of the PCB is opposite to the board transmission mechanism 10. Specifically, the rotary member 253 is driven to rotate in a direction represented by an arrow 106 in FIG. 11.

Figure 12:
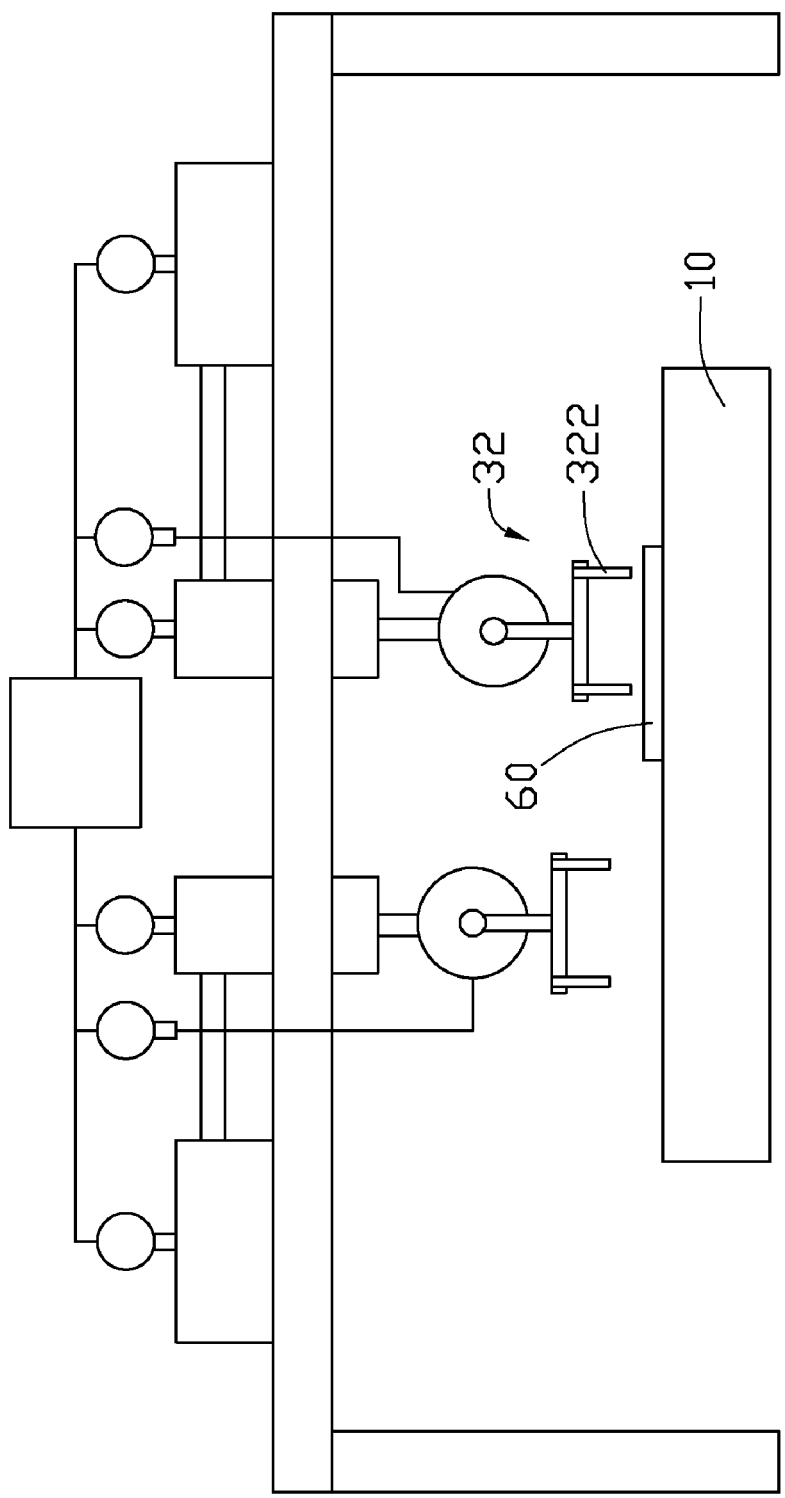

Finally, in step 6, referring to FIG. 12, the PCB 60 is released onto the board transmission mechanism 10. The PCB 60 will be released when air pressure in the vacuum cups 322 is lowered.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A board inverter for inverting a board on a conveyor, the conveyor having a supporting surface, the board having a first surface facing toward the supporting surface and an opposite second surface facing away from the supporting surface, the board inverter comprising:
    a first board picking device for picking up the board from the conveyor, the first board picking device being linearly movable relative to the conveyor and rotatable about a first axis between a first position where the first surface of the picked board faces toward the supporting surface of the conveyor, and a second position where the first surface is substantially perpendicular to the supporting surface of the conveyor;
    a second board picking device, at least one of the first and second board picking devices being movable relative to the other, the second board picking device being rotatable about a second axis between a first position where the first surface of the picked board is substantially perpendicular to the supporting surface of the conveyor and the second board picking device is capable of picking up the board from the first board picking device, and a second position where the second surface of the picked board faces toward the supporting surface of the conveyor; and
    a first rotary driving mechanism comprising a first revolving cylinder, a first partitioning plate fixed to the inner sidewall of the first revolving cylinder, a first rotary member rotatably disposed on the first partitioning plate and a first power supply member, the first partitioning plate and the first rotary member cooperatively defining two separated first chambers in the first revolving cylinder, an outermost end of the first rotary member extending outwardly from the first revolving cylinder, the first power supply member being in communication with the two first chambers, the first board picking device being secured to the first rotary member.

2. The board inverter for inverting a board on a conveyor as claimed in claim 1, wherein the first axis is parallel to the second axis.

3. The board inverter for inverting a board on a conveyor as claimed in claim 1, wherein the second board picking device is linearly movable relative to the conveyor.

4. The board inverter for inverting a board on a conveyor as claimed in claim 1, wherein the first board picking device is linearly movable in a direction perpendicular to the first axis.

5. The board inverter for inverting a board on a conveyor as claimed in claim 1, wherein the first board picking device is linearly movable in a direction parallel to the supporting surface.

6. The board inverter for inverting a board on a conveyor as claimed in claim 1, wherein the second board picking device linearly movable in a direction perpendicular to the second axis.

7. The board inverter for inverting a board on a conveyor as claimed in claim 1, wherein the second board picking device linearly movable in a direction parallel to the supporting surface.

8. The board inverter for inverting a board on a conveyor as claimed in claim 1, further comprising a first cylinder having a cylinder tube, a piston, a shaft slidably relative to the cylinder tube, the first or second board picking device being secured to the shaft.

9. The board inverter for inverting a board on a conveyor as claimed in claim 8, further comprising a second cylinder having a cylinder tube, a piston, a shaft slidably relative to the cylinder tube, the first cylinder being secured to the shaft of the second cylinder.

10. The board inverter for inverting a board on a conveyor as claimed in claim 9, wherein the shaft of the first cylinder is perpendicular to that of the second cylinder.

11. The board inverter for inverting a board on a conveyor as claimed in claim 9, wherein the first cylinder or the second cylinder is pneumatic or hydraulic.

12. The board inverter for inverting a board on a conveyor as claimed in claim 1, wherein the first and second board picking devices are vacuum suction devices.

13. The board inverter as claimed in claim 1, further comprising a second rotary driving mechanism comprising a second revolving cylinder, a second partitioning plate fixed to the inner sidewall of the second revolving cylinder, a second rotary member rotatably disposed on the second partitioning plate and a second power supply member, the second partitioning plate and the second rotary member cooperatively define two separated second chambers in the second revolving cylinder, an outermost end of the second rotary member extends outwardly from the second revolving cylinder, the second power supply member is in communication with the two second chambers, the second board picking device being secured to the second rotary member.

14. A board inverting system, comprising:
    a conveyor having a supporting surface, the conveyor being configured for conveying boards having a first surface facing toward the supporting surface and an opposite second surface facing away from the supporting surface; and
    a board inverter comprising:
    a first board picking device for picking up the board from the conveyor, the first board picking device being linearly movable relative to the conveyor and rotatable about a first axis between a first position where the first surface of the picked board faces toward the supporting surface of the conveyor, and a second position where the first surface is substantially perpendicular to the supporting surface of the conveyor;
    a second board picking device, at least one of the first and second board picking devices being movable relative to the other, the second board picking device being rotatable about a second axis between a first position where the first surface of the picked board is substantially perpendicular to the supporting surface of the conveyor and the second board picking device is capable of picking up the board from the first board picking device, and a second position where the second surface of the picked board faces toward the supporting surface of the conveyor; and
    a first rotary driving mechanism comprising a first revolving cylinder, a first partitioning plate fixed to the inner sidewall of the first revolving cylinder, a first rotary member rotatable disposed on the first partitioning plate and a first power supply member, the first partitioning plate and the first rotary member cooperatively defining two separated first chambers in the first revolving cylinder, an outermost end of the first rotary member extending outwardly from the first revolving cylinder, the first power supply member being in communication with the two first chambers, the first board picking device being secured to the first rotary member.

15. The board inverter for inverting a board on a conveyor as claimed in claim 14, further comprising a first cylinder having a cylinder tube, a piston, a shaft slidably relative to the cylinder tube, the first or second board picking device being secured to the shaft.

16. The board inverter for inverting a board on a conveyor as claimed in claim 15, further comprising a second cylinder having a cylinder tube, a piston, a shaft slidably relative to the cylinder tube, the first cylinder being secured to the shaft of the second cylinder.

17. The board inverter for inverting a board on a conveyor as claimed in claim 16, wherein the shaft of the first cylinder is perpendicular to that of the second cylinder.

18. The board inverter for inverting a board on a conveyor as claimed in claim 14, further comprising a second rotary driving mechanism comprising a second revolving cylinder, a second partitioning plate fixed to the inner sidewall of the second revolving cylinder, a second rotary member rotatably disposed on the second partitioning plate and a second power supply member, the second partitioning plate and the second rotary member cooperatively defining two separated second chambers in the second revolving cylinder, an outermost end of the second rotary member extending outwardly from the second revolving cylinder, the second power supply member being in communication with the two second chambers, the second board picking device being secured to the second rotary member.

* * * * *